United States Patent
Kikuchi

(10) Patent No.: US 7,323,938 B2
(45) Date of Patent: Jan. 29, 2008

(54) AMPLIFIER CIRCUIT AND LIGHT RECEIVING APPARATUS

(75) Inventor: Mitsuru Kikuchi, Tokyo (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 123 days.

(21) Appl. No.: 11/282,480

(22) Filed: Nov. 21, 2005

(65) Prior Publication Data

US 2006/0109057 A1      May 25, 2006

(30) Foreign Application Priority Data

Nov. 22, 2004   (JP)   ............................ 2004-337297

(51) Int. Cl.
*H03F 3/08* (2006.01)
(52) U.S. Cl. ........................... 330/308; 330/86
(58) Field of Classification Search .................. 330/86, 330/308; 250/214 AG
See application file for complete search history.

(56) References Cited

U.S. PATENT DOCUMENTS

| | | | |
|---|---|---|---|
| 6,246,282 B1 * | 6/2001 | Oono et al. .................... | 330/86 |
| 7,158,729 B2 | 1/2007 | Yokomizo | |
| 2003/0165207 A1 * | 9/2003 | Noguchi et al. ............. | 375/371 |
| 2006/0087378 A1 * | 4/2006 | Hayakawa ................... | 330/308 |

FOREIGN PATENT DOCUMENTS

| JP | 2001-144552 | 5/2001 |
|---|---|---|
| JP | 2003-198296 | 7/2003 |

* cited by examiner

*Primary Examiner*—Steven J. Mottola
(74) *Attorney, Agent, or Firm*—Finnegan, Henderson, Farabow, Garrett & Dunner, LLP

(57) ABSTRACT

An amplifier 11 to which transistors 13 and 14 functioning as variable resistors are connected in parallel is used. A burst signal is received by a light receiving element 10 and the received signal is converted into an input current signal Iin. The input current signal Iin is converted in the amplifier 11 into an output voltage Vo. Determination is made in a determining circuit 20 as to whether the output voltage Vo exceeds a current voltage V1 which is a threshold. The result of determination is stored in a register circuit 15. Based on the result of determination outputted from the register circuit 15, a desired voltage is selected from among a number of voltages generated beforehand in a control voltage generating circuit. The selected voltage is used to generate a control voltage Vg1 or Vg2 to be applied to the transistors 13 and 14; and the generated control voltage Vg1 or Vg2 is inputted to the transistor 13 or 14 of the amplifier 11.

12 Claims, 12 Drawing Sheets

AMPLIFIER CIRCUIT AND LIGHT RECEIVING APPARATUS

This application claims priority from Japanese Patent Application No. 2004-337297 filed Nov. 22, 2004, which is hereby incorporated by reference herein.

BACKGROUND OF THE INVENTION

1. Field of the Invention

The present invention relates to an amplifier circuit and a light receiving element which are applicable to the field of optical communication.

2. Description of the Related Art

FIG. 10 shows a first conventional example of an amplifier circuit proposed as a first-stage amplifier circuit for a burst signal (see Patent Document 1).

In the first-stage amplifier circuit, an amplifier circuit 11, which converts an input current signal provided from a photodetector 10 into a voltage, a feedback resistor 101 connected between the input and output terminals of the amplifier circuit 11, and a switch 104 or 105 connected in series to a resistor 102 or 103 are connected in parallel.

A determining circuit 110 determines whether or not an output signal Vo amplified by the amplifier circuit 11 exceeds a reference voltage 111. If it is determined that the output signal Vo exceeds the reference voltage 111, the result of the determination is memorized into a memory element 112 or 113. The output of the memory element 112 or 113 is used as a control signal of the switch 104 or 105 and thereby a resistor 102 or 103 according to switching operation is connected to the feedback resistor 101 in parallel to vary the gain of the first-stage amplifier circuit.

In the above-described first-stage amplifier circuit, when the light receiving element 10 detects a pulsed light, a pulsed photo-current having an amplitude according to the intensity of the pulsed light is generated and inputted into the amplifier circuit 11. The inputted current is varied to the output signal Vo having a voltage amplitude according to the resistance value of the feedback resistor 101. The amplitude value of the output signal Vo is compared to the reference voltage 111 in the determining circuit 110. When the output amplitude value exceeds the reference voltage, the output of the determining circuit 110 is varied. Then, a VCC voltage is memorized into the memory element 112 and the output value of the memory element 112 is varied to close the switch 104.

When the switch 104 is closed, the feedback resistance value becomes the parallel resistance value between the feedback resistor 101 and the resistor 102, and thus the gain of the first-stage amplifier circuit is decreased. When the next pulse of the pulsed light is entered, a voltage amplitude value according to the parallel resistance between the feedback resistor 101 and the resistor 102 is outputted as the output signal Vo, which is compared to the reference voltage 111 in the determining circuit 110. If the voltage amplitude value of the output signal Vo exceeds the reference voltage 111, the VCC voltage is shifted to the memory element 113, the switch 105 is closed, and thus the gain of the first-stage amplifier circuit is decreased.

By controlling the switches 104 and 105 according to the intensity of the pulsed light, the gain of the first-stage amplifier circuit is varied so as not to saturate the output of the first-stage amplifier circuit. Thus, a wide dynamic range can be achieved and a rapid-response circuit structure can be obtained under simple control.

FIG. 11 shows a second conventional example of an amplifier circuit which does not use control of the opening and closing of switches (see Patent Document 2). The first-stage amplifier circuit includes an amplifier circuit 11 that an input current signal outputted from a light receiving element 10 is varied to a voltage, a feedback resistor 101 connected between the input and output terminals of the amplifier circuit 11, and a variable resistor 201 that a resistance value is varied according to a control voltage connected to the feedback resistor 101 in parallel.

When an input current signal is outputted from the light receiving element 10, a current detector circuit 202 generates a DC (direct current) voltage for generating a dummy direct current equal to the peak value of the input current and inputs the generated DC voltage to a dummy current generating circuit 203. The dummy current generating circuit 203 outputs a DC voltage Vp, which is obtained when the dummy direct current is inputted to the amplifier circuit 11. The current voltage Vp is inputted to an amplitude control circuit 204 and the current voltage Vp is compared to a reference voltage, thereby generating a control voltage Vc according to the difference of the compared value. The control voltage Vc becomes a control voltage of the variable resistor 201 and the parallel resistance comprised of the feedback resistor 101 and the variable resistor 201 is varied based on the control voltage. By controlling the variable resistor 201, the output amplitude of the amplifier circuit 11 becomes a constant value regardless of the amplitude of the input current signal.

As described above, the peak value of an input current is detected and the control voltage Vc of the variable resistor is generated. Accordingly, the value of the parallel feedback resistance can be controlled steplessly and an output voltage Vo of the amplifier circuit 11 that has a constant amplitude can be obtained. Further, as the first conventional example, the effect derived from switching noise can be ignored.

However, in a system that switches are connected to resistors in series and the opening and closing of the switches are controlled such as the first conventional example shown in FIG. 10, the accuracy of the feedback resistance value becomes lower unless the on-resistance of the switches is smaller than the resistance of the resistors connected to the switches in series. As a result, if the on-resistance of the switches is forced to be smaller by making a size of the switches larger, a problem may be occurred such as the effect of noise during switching or the reduction of switching speed.

FIG. 12 shows an example of noise generated during switching of switches in the first conventional example.

FIG. 12 shows the input current Iin outputted from the light receiving element 10, the output voltage Vo of the amplifier circuit, the opening and closing state (on-off state) of the switches 104 and 105. The assumption is that the value of the input current Iin is large and the gain is switched between two levels.

As can be seen from FIG. 12, the output voltage Vo is varied immediately after the switches 104, 105 are switched and thus switching noise is occurred. In this case, switching noise may be reduced to a certain degree by altering circuit structure. However, it is considerably difficult to completely eliminate switching noise as long as switches 104, 105 are opened or closed.

On the other hand, in the second conventional example shown in FIG. 11 that a control of the opening and closing of switches is not performed, the circuit structure is more complicated. In addition, response speed is limited because the peak value of an input current is detected and a control voltage is generated by feedback control due to the detected peak value.

SUMMARY OF THE INVENTION

Therefore, an object of the present invention is to provide an amplifier circuit capable of providing a wide dynamic range according to high speed response.

Another object of the present invention is to provide an amplifier circuit in which switching noise can be eliminated and a structure in a smaller size at lower cost can be provided, in addition to a wide dynamic range.

Yet another object of the present invention is to provide a light receiving apparatus including an amplifier circuit according to a burst signal in optical communication.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Embodiments of the present invention will be described below in detail with reference to the accompanying drawings.

EXAMPLE 1

A first embodiment of the present invention will be described with respect to FIGS. 1 to 4.

<Circuit Structure>

Figure 1:
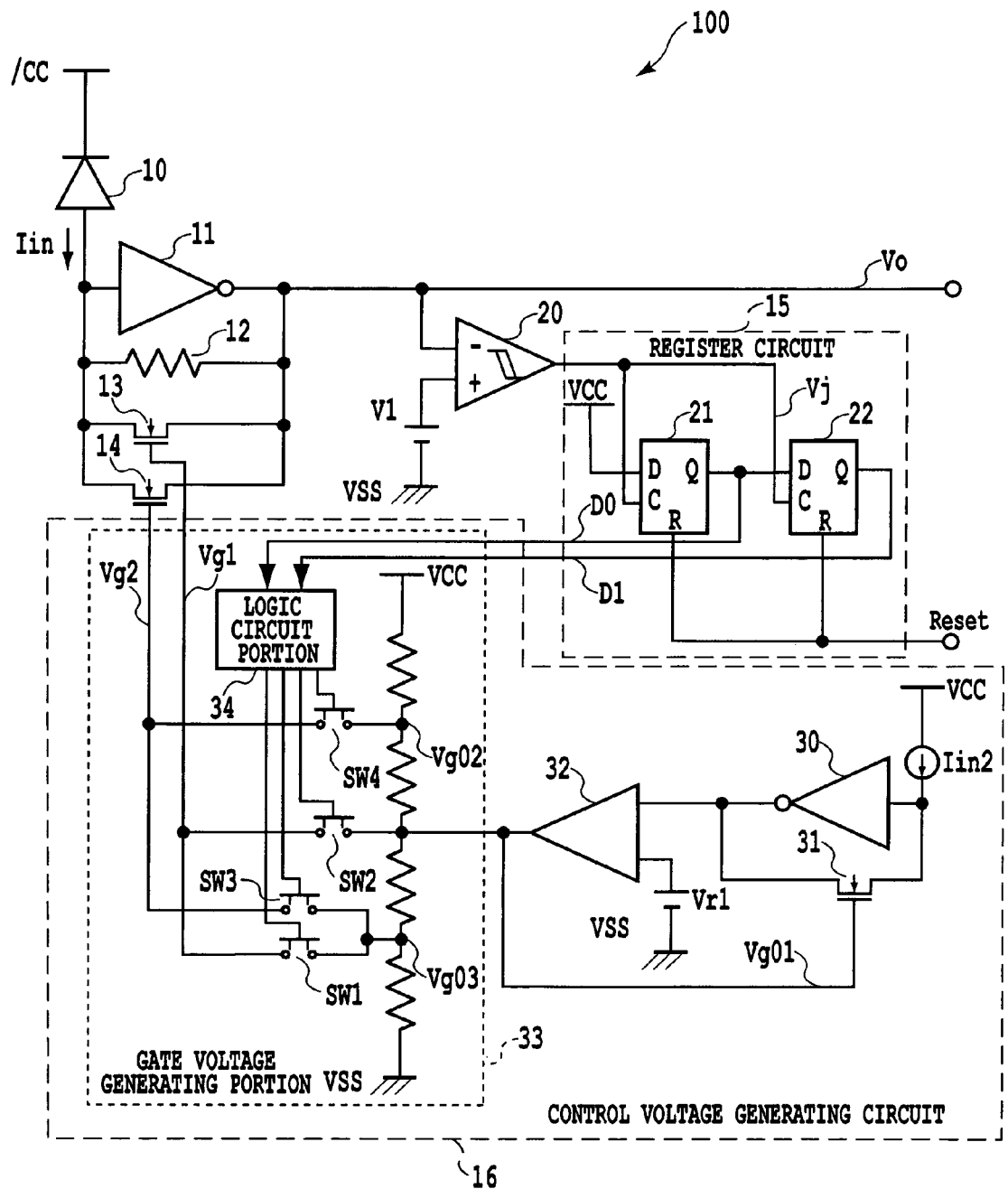
FIG. 1 is a circuit diagram showing a configuration of an amplifier circuit according to a first embodiment of the present invention.

FIG. 1 shows an exemplary configuration of an amplifier circuit 100 according to the present invention.

A configuration of the amplifier circuit 100 will be described.

A first amplifier 11 has a function of converting an input current signal outputted from a light receiving element 10 into a voltage.

A feedback resistor 12 is connected between the input and output terminals of the first amplifier 11 and has at least one variable resistor 13, 14 that changes its resistance value in accordance with a control voltage.

A determining circuit 20 has a function of determining whether or not an output signal converted into a voltage by the first amplifier 11 exceeds a predetermined threshold.

A memory circuit (register circuit) 15 stores the result of determination by the determining circuit 20.

A control voltage generating circuit 16 has a function of varying a control voltage to be provided to the variable resistor(s) 13, 14 in accordance with an output signal outputted from the register circuit 15.

In the above amplifier circuit, the variable resistors 13, 14 are structured by transistors, in which an output voltage from the control voltage generating circuit 16 is applied to a gate or base of the transistors.

A structure of the control voltage generating circuit 16 will be described below.

A second amplifier 30 has the same output characteristics as the first amplifier 11.

A reference transistor 31 is connected between the input and output terminals of the second amplifier 30 and has a function of generating a reference resistance value.

A reference direct current Iin 2 is an input signal inputted to the second amplifier 30.

A third amplifier 32 has a function of applying an output voltage to the gate or base of the reference transistor 31 so as to reduce the difference between a output voltage from the second amplifier 30 and the reference voltage.

The control voltage generating circuit 16 is featured in that a control voltage to be supplied to the variable resistors 13, 14 is generated based on the output voltage outputted from the third amplifier 32.

The configuration of the amplifier circuit 100 will be described in further detail with respect to FIG. 1.

The amplifier 11 converts an input current signal Iin outputted from the light receiving element 10 to an output voltage Vo.

A feedback resistor 12 is connected between the input and output terminals of the amplifier 11 and determines initial gain.

The transistors 13 and 14 are variable resistors that resistance values are varied according to the amplitude of an input signal.

The determining circuit 20 compares the output voltage Vo of the amplifier 11 with a determination reference voltage V1. If the output voltage Vo is greater than the reference voltage, output voltage value Vj is varied as long as the voltage Vo exceeds the reference voltage.

The register circuit 15 stores the result of determination by the determining circuit 20.

The control voltage generating circuit 16 has a function that control voltages Vg1 and Vg2 for controlling the transistors 13 and 14 are varied according to outputs D0 and D1 outputted from the register circuit 15.

The transistors 13 and 14 are structured by n-channel MOS transistors. When a reset signal Reset is inputted from an external source, the memory elements in the register circuit 15 return to initial state.

In the register circuit 15, a DFF (D Flip-Flop) 21 is connected to a DFF 22 (D Flip-Flop) in shift register form.

The input D of DFF 21 is connected to VCC and the input D of DFF 22 is connected to the output D0 of DFF 21.

The inputs C of DFF 21 and DFF 22 are connected to the output Vj of the determining circuit 20. When the output Vj of the determining circuit 20 is varied for the first time, VCC is outputted at the output D0 of DFF 21; when the output Vj is varied for the second time, then VCC is shifted to the output D1 of DFF 22.

The structure of the control voltage generating circuit 16 will be described in further detail with respect to FIG. 1.

The amplifier 30 has the same output characteristics as the amplifier 11.

The reference transistor 31 is connected between the input and output terminals of the amplifier 30 and generates a reference resistance value.

The direct current input Iin2 is input of the amplifier 30.

The amplifier 32 outputs a gate reference voltage Vg01 for the gate of the reference transistor 31 so as to reduce the difference between an output from the amplifier 30 and a reference voltage Vr1.

A gate voltage generating 33 generates a control voltage to be applied to the gates of the transistors 13 and 14 from an output voltage of the amplifier 32.

A configuration of the gate voltage generating 33 will be described below.

An output section Vg02 outputs a voltage Vg02 which is provided by dividing the segment between VCC and the gate reference voltage Vg01 by resistors.

An output section Vg03 outputs a voltage Vg03 which is provided by dividing the segment between VSS and the gate reference voltage Vg01 by resistors.

A logic circuit 34 is connected to switches SW1, SW2, SW3, and SW4. The logic circuit 34 generates a control signal for the switches when outputs D0 and D1 from the register circuit 15 are inputted to input terminals and controls switches SW1, SW2, SW3, and SW4 based on the generated control signal.

<First Example of Operation>

Operation of the circuit shown in FIG. 1 will be described.

When a reset signal Reset is inputted, the memory elements in the register circuit 15 are reset to the initial state. When outputs D0 and D1 from the register circuit 15 are inputted to the logic circuit 34, SW1 and SW3 are closed, SW2 and SW4 are opened. As a result, voltage Vg03 is applied to the gate control voltages Vg1 and Vg2 of the transistors 13 and 14. Here, R12 denotes the resistance value of the fixed feedback resistor 12 and R13 (Vg03) and R14 (Vg03) denote the resistance values of the transistors 13 and 14 under voltage Vg03 being applied to their gates voltage Vg1 and Vg2. Then, the relation between the resistances becomes R12<<R13 (Vg03) or R14 (Vg03). Voltage Vg03 is determined such that the combined resistance of the fixed feedback resistor 12 and the transistors 13 and 14 is substantially equal to the value of R12.

The values of voltages Vg01 and Vg02 are set such that the combined resistance of the fixed feedback resistance 12 and the transistors 13 and 14 are sufficiently smaller than the value of R12 when the voltages are applied to the resistors 13 and 14. Specific voltage values are determined appropriately based on the input range of the input current signals Iin or the sizes of the transistors 13 and 14.

When an input current signal Iin is inputted to the amplifier 11, the output Vj of the determining circuit 20 is varied and outputs D0 and D1 of the register circuit 15 are varied according to the variation in the output Vj, and further the output from the logic circuit 34 is varied in response to the output. Accordingly, the opening and closing states of SW1, SW2, SW3, and SW4 are varied and thus the resistance values of the transistors 13 and 14 are varied. Accordingly, the combined resistance of the fixed feedback resistor 12 and the transistors 13 and 14 is varied, thereby controlling the gain of the amplifier circuit.

In the example described above, the control voltage applied to the variable resistors 13, 14 structured by transistors has a voltage value such that the feedback resistance value becomes adequately large when a value of an input current signal inputted to the first amplifier 11 is almost zero or a very small value. When a relatively large input current signal is inputted to the first amplifier 11 and an output value of the first amplifier 11 exceeds the determination reference value in the determining circuit 20, the control voltage is varied to a DC (direct current) voltage value which is provided beforehand in the control voltage generating circuit 16 such that the resistance of the parallel resistor combined by the feedback resistor 12 and the variable resistors 13, 14 becomes a predetermined value.

When such a large input current signal is inputted, the control voltage for controlling the variable resistors 13, 14 is varied and thus the feedback resistance becomes small, thereby reducing the gain of the amplifier circuit and managing a wide range of a level of an input current signal without saturating the output.

Because the control voltage for controlling the variable resistors 13, 14 is controlled by using a voltage applied to the gate or base of the reference transistor 31, the resistance value of the reference transistor 31 and the resistances of the variable resistors 13, 14 are inversely proportional to the ratio of the size of a transistor.

Furthermore, if a DC reference current and a second reference voltage are generated by using an output of a highly precise reference voltage circuit such as a band-gap circuit, the absolute accuracy of the resistance value of the reference transistor 31 is improved and thus the absolute accuracy of the resistance values of the variable resistors 13, 14 can be improved.

Figure 2:
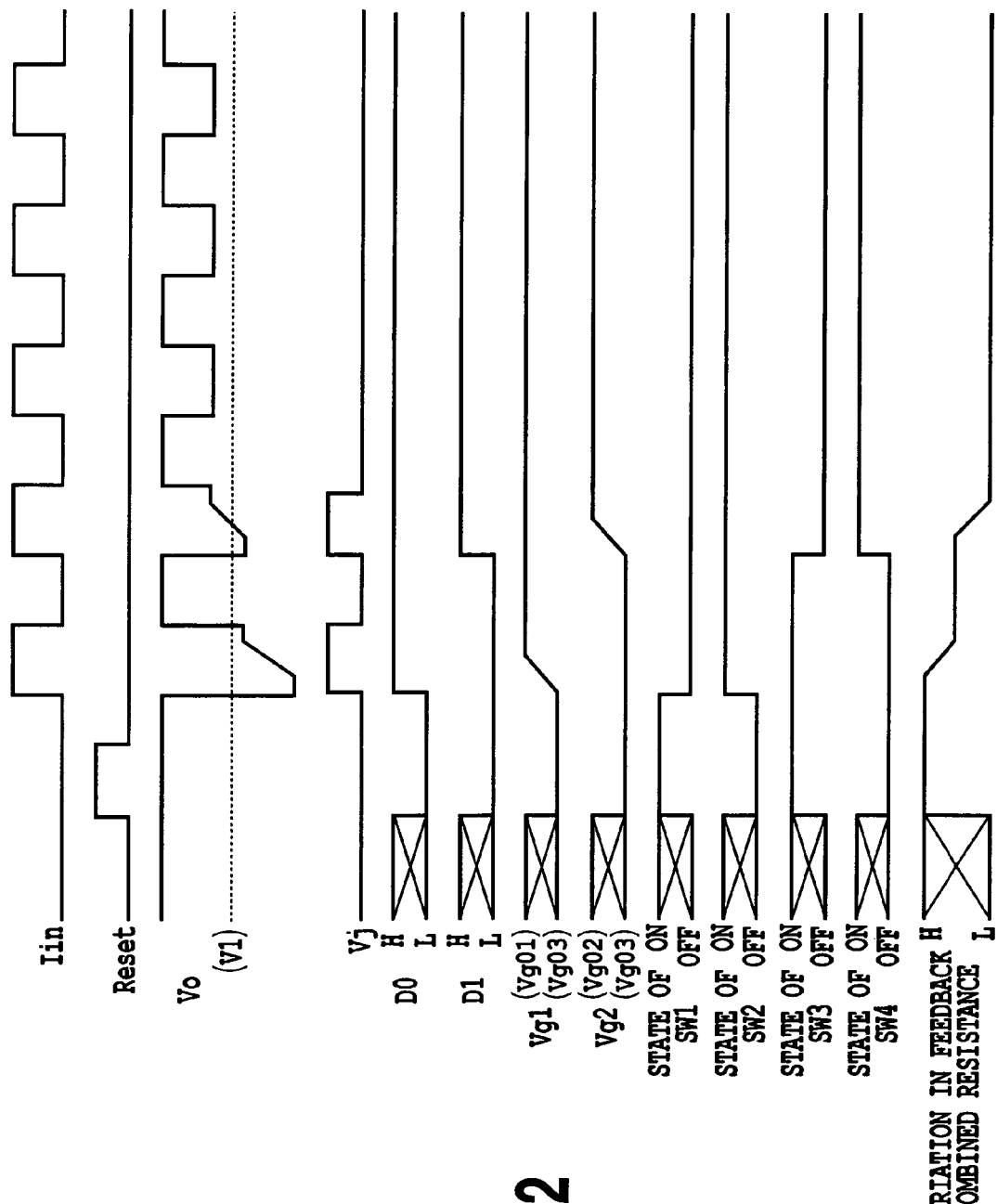
FIG. 2 is a timing chart showing an example of operation of the amplifier circuit shown in FIG. 1 performed upon reception of large-level input.

FIG. 2 is a timing chart showing an example of operation performed when a burst signal is received.

This example is a structure for controlling gain by using two input pulses at the maximum. The operation will be described with respect to FIGS. 1 and 2.

The timing chart shows the state of variation in a signal, the state of the opening and closing (the ON-OFF state) of SW1-SW4, and the state of qualitative variation of a feedback combined resistance structured by the feedback resistor 12 and the transistors 13 and 14 connected between the input and output terminals of the amplifier circuit 11.

After a reset signal Reset is inputted, the first pulse of a pulsed input current signal Iin outputted from the light receiving element 10 is converted into a signal output voltage Vo in the amplifier circuit 11, then the voltage Vo is compared with the determination reference voltage V1 in the determining circuit 20. As a result of comparison, if the output voltage Vo is greater than the determination reference voltage V1, the output voltage Vj of the determining circuit 20 is varied and the varied result is reflected in the output D0 of DFF 21 as a memory element. Outputs D0 and D1 are inputted to the logic circuit 34 and a control signal outputted from the logic circuit 34 controls SW1, SW2, SW3 or SW4.

In FIG. 2, output D0 of DFF 21 is varied from logical value L (low) to logical value H (high). In response to the control signal outputted from the logical circuit 34, SW1 is varied from the ON state to the OFF state and SW2 is varied from the OFF state to the ON state. Accordingly, the gate control voltage Vg1 for the transistor 13 is varied from Vg03 to Vg01 and the resistance value of the transistor 13 as the variable resistor is varied. Consequently, the feedback combined resistance is varied from the initial large value to a smaller value and the gain of the first-stage amplifier circuit is decreased to lower the amplitude of the output voltage Vo.

It is assumed in the example of operation shown in FIG. 2 that the input current signal Iin is equal to a large level in the case where the reduction of gain is insufficient by controlling the gain only once. Thus, a signal output voltage Vo generated by voltage conversion in the amplifier circuit 11 due to the second pulse of the pulsed input current signal Iin outputted from the light receiving element 10 is still greater than the determination reference voltage V1 in the determining circuit 20. In this case, the output voltage Vj of the determining circuit 20 is varied, the output D0 of DFF21 is shifted to DFF22, the output D1 of DFF22 is varied from logical L to logical H and, in response to the control signal outputted from the logic circuit 34, SW3 is varied from the ON state to the OFF state and SW4 is varied from the OFF state to the ON state. The gate control voltage Vg2 for controlling the gate of the transistor 14 is varied from voltage Vg03 to Vg02, and the resistance value of the transistor 14 as the variable resistor is varied. As a result, feedback combined resistance becomes a smaller value and the gain of the first-stage amplifier circuit is decreased, and the amplitude of the output voltage Vo also is lowered. For the third pulse and subsequent of the pulsed input current signal Iin, the signal output voltage Vo from the amplifier circuit 11 does not exceed the determination reference voltage V1, thereby performing optimum gain control.

The signal variation in gate control voltage Vg1 and Vg2 of signals shown in the timing chart are varied with a predetermined slope. The reason is that the slope is occurred due to a time constant based on the portion of divided resistance of the circuit in the gate voltage generating 33, the ON-resistances of the switches, and the gate capacitances of the transistors. Accordingly, the combined feedback resistance and output voltage Vo are not varied steeply but are varied with a predetermined slope.

The operation according to the object of the present invention can be performed regardless of the number of variable resistors 13, 14 as well as the number of determining circuits 20. Further, the number of such resistors or circuits can be determined arbitrarily according to the degree to which a level of a maximum input current signal is set and the degree to which an output amplitude range of the first amplifier before and after switching of a variable resistance is set.

That is, the threshold for switching of the variable resistors 13, 14 is set so as not to saturate the output amplitude of the amplifier 11. The variable resistors 13, 14 are set such that the output amplitude of the amplifier 11 does not become too small because a malfunction of the subsequent circuit may be induced due to the influence of noise. Thus, gain control can be determined based on the case whether or not the level of the maximum input current signal is controlled by what stage of the variable resistors 13, 14.

Further, the number of determining circuits 20 and the structure of the register circuit 15 can be determined based on how many pulses of an input current signal can be used before the gain of the amplifier circuit becomes stable.

For example, if three steps of varying the feedback resistance are required in one pulse duration (here, the state where the gain can be determined based on the feedback resistance in the absence of an input is also regarded as one step), then two determining circuits, two memory elements, and two variable resistors should be provided. The number of variable resistors can be reduced by increasing the number of control voltage values.

In another example in which three steps of varying the feedback resistance is required in two pulses, the one determining circuit, two memory elements, and two variable resistors should be provided. That is, in order to perform three or more steps of varying the feedback resistance in one pulse, a plurality of determining circuits 20 which determine output signals based on different threshold voltages are connected in parallel and thus determination in each determining circuit 20 is forced to perform simultaneously.

The result of determination is memorized into a memory element connected to each determining circuit 20 and switching is made to a control voltage according to the output from the memory element, thereby varying the gain at a time.

If three steps are to be used in two pulses, one determining circuit performs determination two times. If it is determined for the first pulse that the threshold is exceeded, then the result of the determination is memorized into the memory element and the control voltage for the first variable resistor is varied to reduce the gain. If it is determined for the second input pulse that the threshold is still exceeded, then the result of the determination is memorized into the second memory element and the control voltage for the second variable resistor is varied to reduce the gain. The number of steps is not limited three of this example. More or less steps can be provided.

As described above, by using the amplifier 11 to which the feedback resistor 12 and the transistors 13 and 14 which function as variable resistors used for gain control are connected in parallel, an input burst signal is converted to an input current signal Iin through the light receiving element 10. Thus, the input current signal Iin is converted into an output voltage Vo at the amplifier 11, determination is made at the determining circuit 20 as to whether the output voltage Vo exceeds a threshold direct current voltage V1, and the result of the determination is stored in the register circuit 15.

Then, according to the result of the determination outputted from the register circuit 15, a desired voltage is selected from among a number of voltages generated beforehand in the control voltage generating circuit 16, and the selected voltage is used to generate a control voltage Vg1 or Vg2 to be applied to the transistor 13 or 14.

The generated control voltage Vg1 or Vg2 is inputted to the transistor 13 or 14. Then, the output of the transistor 13 or 14 is varied linearly, that is, in analog form, according to the input control voltage Vg1 or Vg2, thereby controlling the combined resistance between the input and output terminals of the amplifier 11. As a result, the gain of the amplifier 11 can be controlled and the output of the amplifier 11 can be controlled so as not to saturate.

As above technique, an amplifier circuit capable of a high-speed response can be constructed. The amplifier circuit can be constructed as a light receiving apparatus receiving a burst signal capable of a wide dynamic range. Further, the amplifier circuit of this example according to the present invention can be applicable to the field of optical communication because the wide dynamic range of an input signal and high speed response can be performed.

Thus, the amplifier circuit of the present example can eliminate switching noise as compared with the configuration that uses control of the opening and closing state of switches as the first conventional example. Moreover, the amplifier circuit of the preset example can simplify the circuit for generating a control signal for controlling variable resistors as compared with the structure that does not use control of the opening and closing state of switches as the second conventional example.

<Second Example of Operation>

A circuit operation shown in FIG. 3 will be described.

Figure 3:
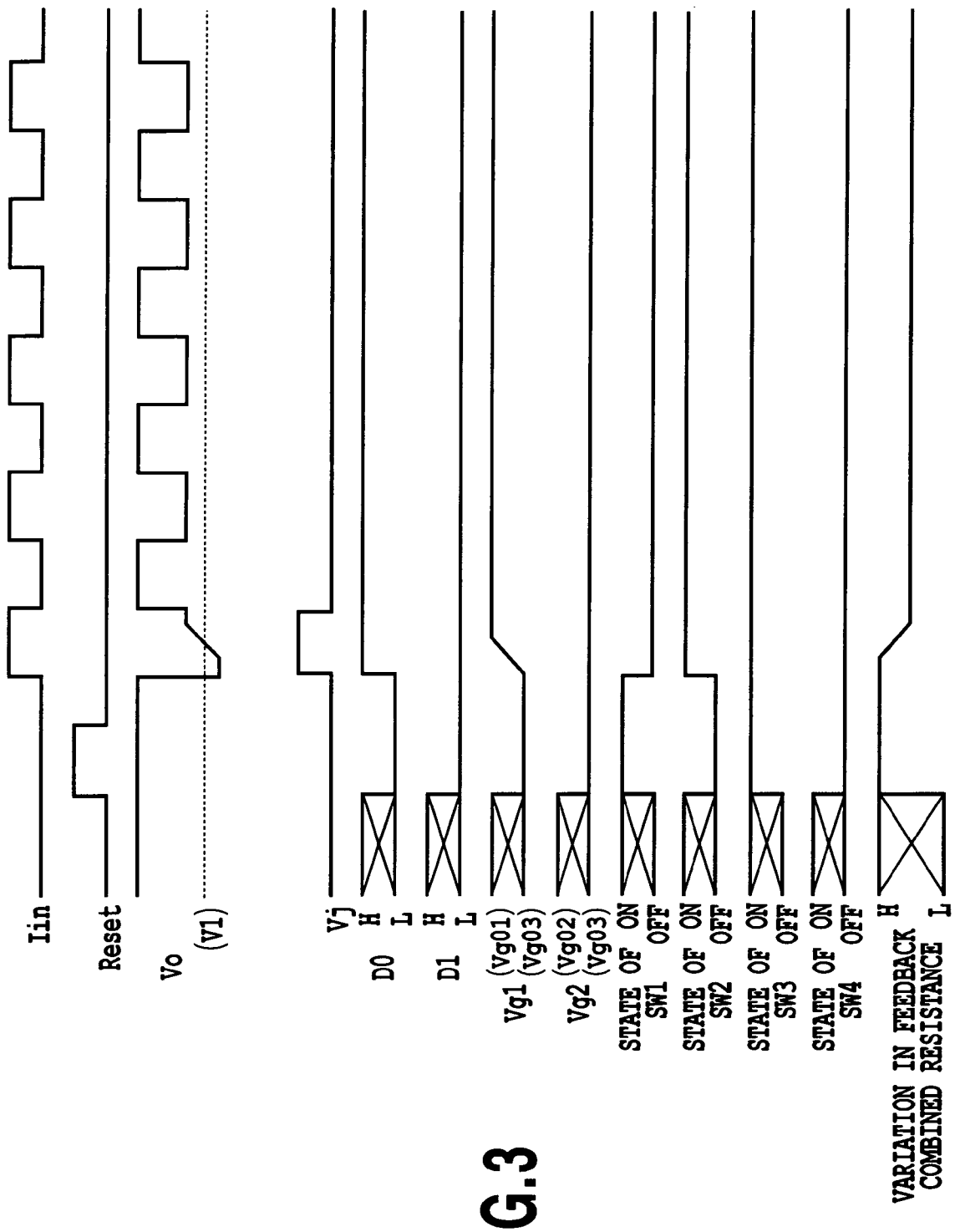
FIG. 3 is a timing chart showing an example of operation of the amplifier circuit shown in FIG. 1 performed upon reception of an intermediate-level input.

FIG. 3 shows an example of a timing chart where the level of an input current signal Iin is moderate, that is, somewhat smaller than the one shown in FIG. 2.

Only when the first pulse of a pulsed input current signal Iin outputted from the light receiving element 10 is inputted after the input of a reset signal Reset, the signal output voltage Vo of the amplifier 11 exceeds the determination reference voltage V1 and voltage applied to the gates of the transistor 13 is varied to perform gain control.

For the second and subsequent pulses of the pulsed input current signal Iin, the signal output voltage Vo of the amplifier 11 does not exceed the determination reference voltage V1 in the determination circuit 20. This shows that optimum gain control has been accomplished.

<Third Example of Operation>

A circuit operation shown in FIG. 4 will be described.

Figure 4:
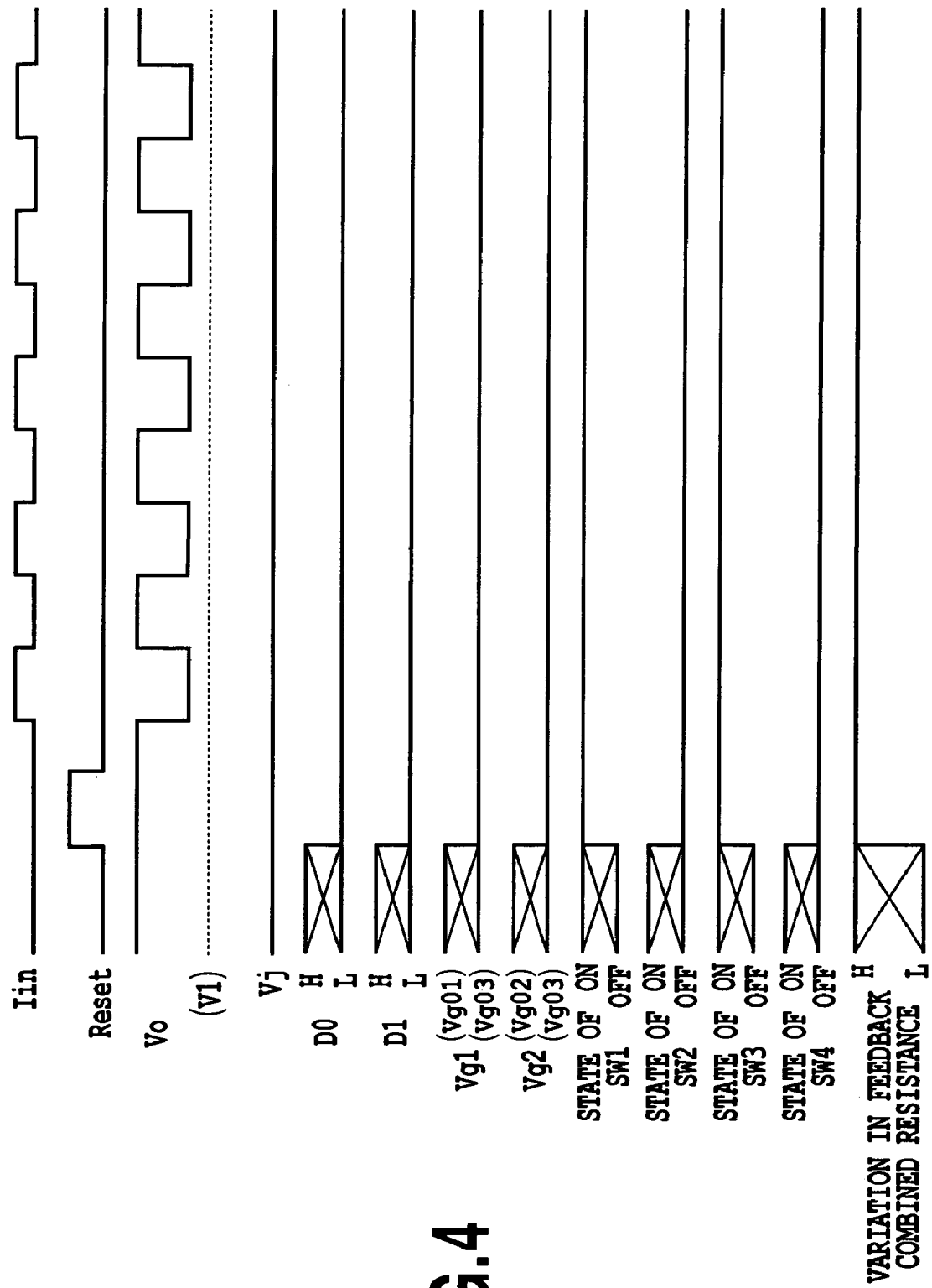
FIG. 4 is a timing chart sowing an example of operation of the amplifier circuit shown in FIG. 1 performed upon reception of a small-level input.

FIG. 4 shows an example of a timing chart where a level of an input current signal Iin is relatively small.

When the first pulse of a pulsed input current Iin outputted from the light receiving element 10 is inputted after the input of the reset signal Reset, the signal output voltage Vo of the amplifier 11 does not exceed the determination reference voltage V1 in the determining circuit 20. The voltage applied to the gates of the transistor 13 and 14 is not varied. This shows that the gain in the initial state after the reset signal Reset is inputted is optimum.

In this way, for a pulsed input current signal Iin, determination as to the signal output voltage Vo of the amplifier 11 is performed by the determining circuit 20, the result of the determination is outputted from the register circuit 15 to the control voltage generating circuit 16, and DC voltages based on the result of the determination is applied to the variable resistors 13, 14 to obtain an optimum gain and thereby a wide dynamic range can be performed.

Further, because the direct current voltages to be applied to the variable resistors 13, 14 are selected from among the direct current voltages generated beforehand, and the difference between the voltages before and after switching is relatively small. Then, noise generated during switching is small and thus the circuit structure is applicable to a high-speed response.

Second Embodiment

A second embodiment according to the present invention will be described with respect to FIGS. 5 to 8. The same elements as those in the first embodiment are labeled the same reference numerals and symbols and the description of which will be omitted.

Figure 5:
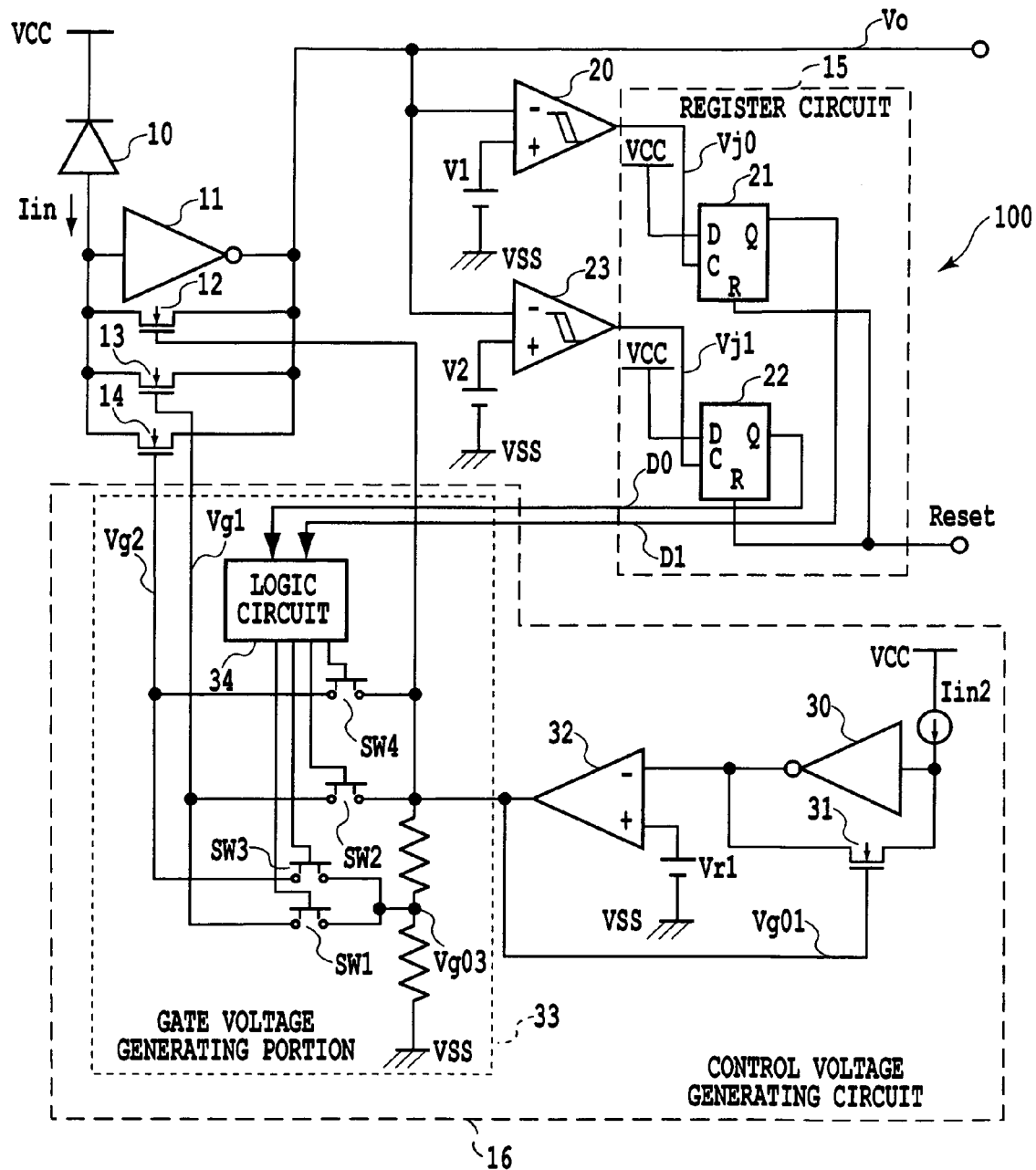
FIG. 5 is a circuit diagram showing a configuration of an amplifier circuit according to a second embodiment of the present invention.

FIG. 5 shows a circuit structure of an amplifier circuit 100 according to the present invention.

The structure of the amplifier circuit 100 will be described below.

An amplifier 11 converts an input current signal Iin outputted from a light receiving element 10 into an output voltage Vo.

A fixed feedback resistor 12 is connected between the input and output terminals of the amplifier 11 and determines the initial gain.

Transistors 13 and 14 are variable resistors that resistance values are varied based on the amplitude of an input signal.

The structure including the amplifier 11, the fixed feedback resistor 12, and the transistors 13 and 14 is the same as the first embodiment.

However, in the second embodiment, the fixed feedback resistor 12 is a transistor, and a gate reference voltage Vg01 generated in a control voltage generating circuit 16 is applied to a gate of the fixed feedback resistor 12 (hereinafter the fixed feedback resistor 12 is referred to as a transistor 12).

The output voltage Vo of the amplifier 11 is compared with determination reference voltages V1 and V2, respectively, which have different voltage values, in parallel-connected determining circuits 20 and 23. If the output voltage Vo exceeds the determination reference voltages, output voltage values Vj0 and Vj1 are varied respectively as long as the reference voltages are exceeded.

A register circuit 15 stores the results of determination by the determining circuits 20 and 23.

The control voltage generating circuit 16 has a function that control voltages Vg1 and Vg2 for controlling the transistors 13 and 14 are varied based on outputs D0 and D1 outputted from the register circuit 15.

The transistors 12, 13, and 14 are n-channel MOS transistors. The memory elements in the register circuit 15 return to initial state in response to a reset signal Reset inputted from an external source.

In the register circuit 15, the output of the determining circuit 20 is connected to the input C of DFF 21, the output of the determining circuit 23 is connected o the input C of DFF 22, and the input D of each of DFFs 21 and 22 is connected to VCC respectively.

The control voltage generating circuit 16 generates a gate reference voltage Vg01 by using amplifiers 30 and 32, a transistor 31, a direct current input Iin2 and a reference voltage Vr1, as in the first embodiment.

The control voltage generating circuit 16 includes a gate voltage generating 33 which generates a control voltage to be applied to the gates of the transistors 13 and 14 based on the gate reference voltage Vg01.

A structure of the gate voltage generating 33 will be described below.

The output voltage Vg03 is a voltage that a resistance line connected between Vss and the gate control voltage Vg01 is divided into two portions. Output terminals of a logic circuit 34 are connected to switches SW1, SW2, SW3, and SW4 and output control signals for each switch based on outputs D0 and D1 of the register circuit 15.

When a reset signal Reset is inputted, the memory elements in the register circuit 15 become initial state. When outputs D0 and D1 of the register circuit 15 is inputted to the logic circuit 34, SW1 and SW3 are closed and SW2 and SW4 are opened. As a result, voltage Vg03 is applied to gate control voltages Vg1 and Vg2 of the transistors 13 and 14. Gate reference voltage Vg01 generated in the control voltage generating circuit 16 is directly applied to the gate voltage of the transistor 12.

Here, R12 denotes the resistance of the transistor 12 that gate reference voltage Vg01 is applied to its gate. R13 (Vg03) and R14 (Vg03) denote the resistances of the transistors 13 and 14 that voltage Vg03 are applied to their gate respectively. Then, relation between these resistances is R12<<R13 (Vg03) or R14 (Vg03). The value of Vg03 is determined such that the combined resistance of the transistors 12, 13, and 14 becomes substantially equal to R12. The size of the transistors 13 and 14 is determined such that the combined resistance of the transistors 12, 13, and 14 becomes sufficiently smaller than the value of R12 when the gate reference voltage Vg01 is applied to the transistors 13 and 14 by controlling the switches.

<Method for Determining Transistor Size>

A specific method for determining the size of a transistor will be described below.

The resistance R31 of the reference transistor 31 of the control voltage generating circuit 16 is as described below. V30 denotes output voltage of the amplifier 30 when inputted DC current is zero. V30 in denotes output voltage of the amplifier 30 when inputted DC current of the amplifier 30 is Iin2. A DC voltage Vg01 is generated such that the DC voltage Vr1 becomes equal to the output voltage V30 in. Here, a reference voltage Vr1 is set by taking into account the output voltage 30 when inputted current of the amplifier 30 is zero, and the accuracy of the resistance values of the variable resistors can be improved.

When the gate reference voltage Vg01 is applied to a gate of the reference transistor 31, the resistance R31 is: R31=(V30 in −V30)/Iin2.

If the resistance R12 of the transistor 12 is to be made equal to the value of R31, the transistor 12 is simply designed in the same size as the reference transistor 31.

R13 (Vg01) and R14 (Vg01) denote the resistances of the transistors 13 and 14 when the gate reference voltage Vg01 is applied to gate control voltages Vg1 and Vg2, respectively. If the ratio of resistances of the transistors is to be set as R12: R13 (Vg01): R14 (Vg01)=6:3:1, the ratio of the transistor size can be set as =1:2:6. In this way, desired resistance values can be obtained simply by varying the sizes of other transistors based on the size of the transistor 31, and resistance values with a high relative accuracy can be obtained by using transistors of the same type.

A parallel combined resistance obtained by the gain control in the present example will be described.

The case where the feedback resistance in the initial state is substantially equal to the value of R12, a standard value is regarded as 1, then R12: (resistance when R12 and R13 (Vg01) is connected in parallel): (resistance when R12, R13 (Vg01), and R14 (Vg01) is connected in parallel)=9:3:1.

If the direct current voltage Vr1 and the direct current Iin2 of the control voltage generating circuit 16 are constructed by using a reference voltage generating circuit such as a bandgap reference circuit that has a high absolute accuracy, thereby the relative accuracy of resistance value of R31 can be increased. Thus, the resistance values of R12, R13 (Vg01), and R14 (Vg01) can be improved in relative accuracy as well as absolute accuracy.

When an input current signal Iin is inputted to the amplifier 11 and the outputs Vj0 and Vj1 of the determining circuits 20 and 23 are varied, the outputs D0 and D1 of the register circuit 15 are varied according to the variation of the outputs. In response to these outputs, the output of the logic circuit 34 also is varied. Accordingly, the opening and closing state of SW1, SW2, SW3, and SW4 are varied and, as a result, the resistances of the transistors 13 and 14 are varied. Accordingly, the combined resistance of the transistors 12, 13, and 14 is varied and the gain of the amplifier circuit is controlled.

<First Example of Operation>

Figure 6:
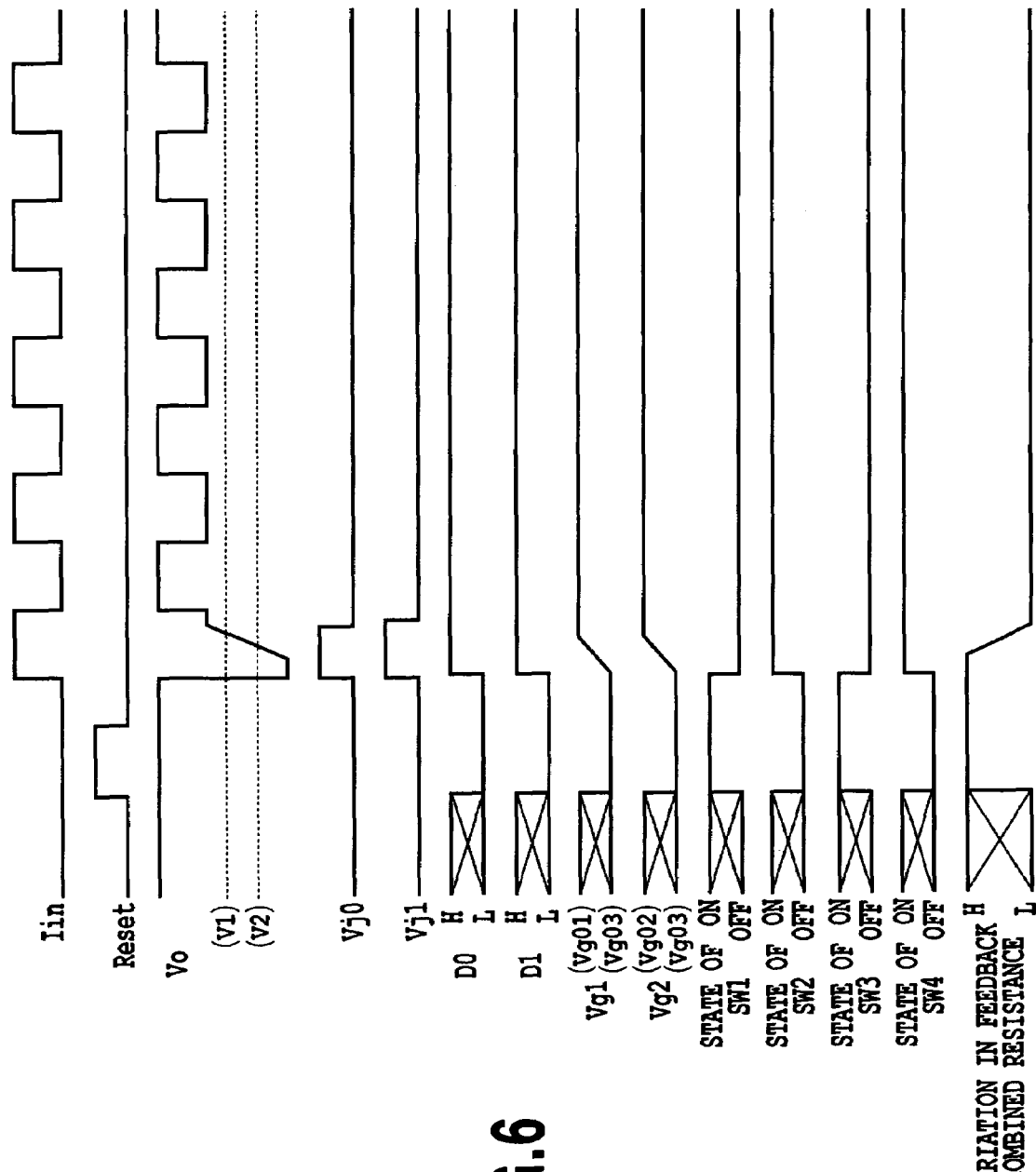
FIG. 6 is a timing chart showing an example of operation of the amplifier circuit shown in FIG. 5 performed upon reception of a large-level input.

FIG. 6 is a timing chart showing an example of operation when a burst signal is received. In this example, gain control is completed in one input pulse. The operation will be described with respect to FIGS. 5 and 6.

After a reset signal Reset is inputted, the first pulse of a pulsed input current signal Iin outputted from the receiving element 10 is converted into a signal output voltage Vo in the amplifier 11. The signal output voltage Vo is compared with the determination reference voltages V1 and V2 in the determining circuits 20 and 23, respectively.

In the example shown in FIG. 6, because the output voltage Vo exceeds the determination reference voltages V1 and V2, both of the output voltage Vj0 and Vj1 of the determining circuits 20 and 23 are varied. Then, the outputs D0 and D1 of DFF 21 and DFF 22, which are memory elements, are varied based on the output voltage Vj0 and Vj1. The outputs D0 and D1 are inputted to the logic circuit 34 and its output signals control switches SW1-SW4.

In the example of operation shown in FIG. 6, both of the outputs D0 and D1 of DFF 21 and DFF 22 are varied from L (low) to H (high), and the gate control voltage Vg1 and Vg2 of the transistors 13 and 14 are varied from DC voltage Vg03 to Vg01, respectively and thus the resistances of the transistors 13 and 14 are varied. As a result, the gain of the amplifier circuit is decreased and the amplitude of the output voltage Vo becomes small.

The example of operation shown in FIG. 6 is assumed that the level of the input current signal Iin is large. This operation is the case where outputs of the two determining circuits are varied at the same time and the gain is significantly decreased. For the second and subsequent pulses of the pulsed input current signal Iin, the signal output voltage Vo of the amplifier 11 does not exceed the determination reference voltages V1 or V2 of the determining circuits 20 or 23. This shows that optimum gain control has been accomplished.

Thus, in this example, an amplifier circuit capable of high-speed response can be structured. The amplifier circuit can be structured as a light receiving apparatus receiving a burst signal capable of a wide dynamic range. Further, the amplifier circuit can be applicable to the field of optical communication.

<Second Example of Operation>

A circuit operation shown in FIG. 7 will be described below.

Figure 7:
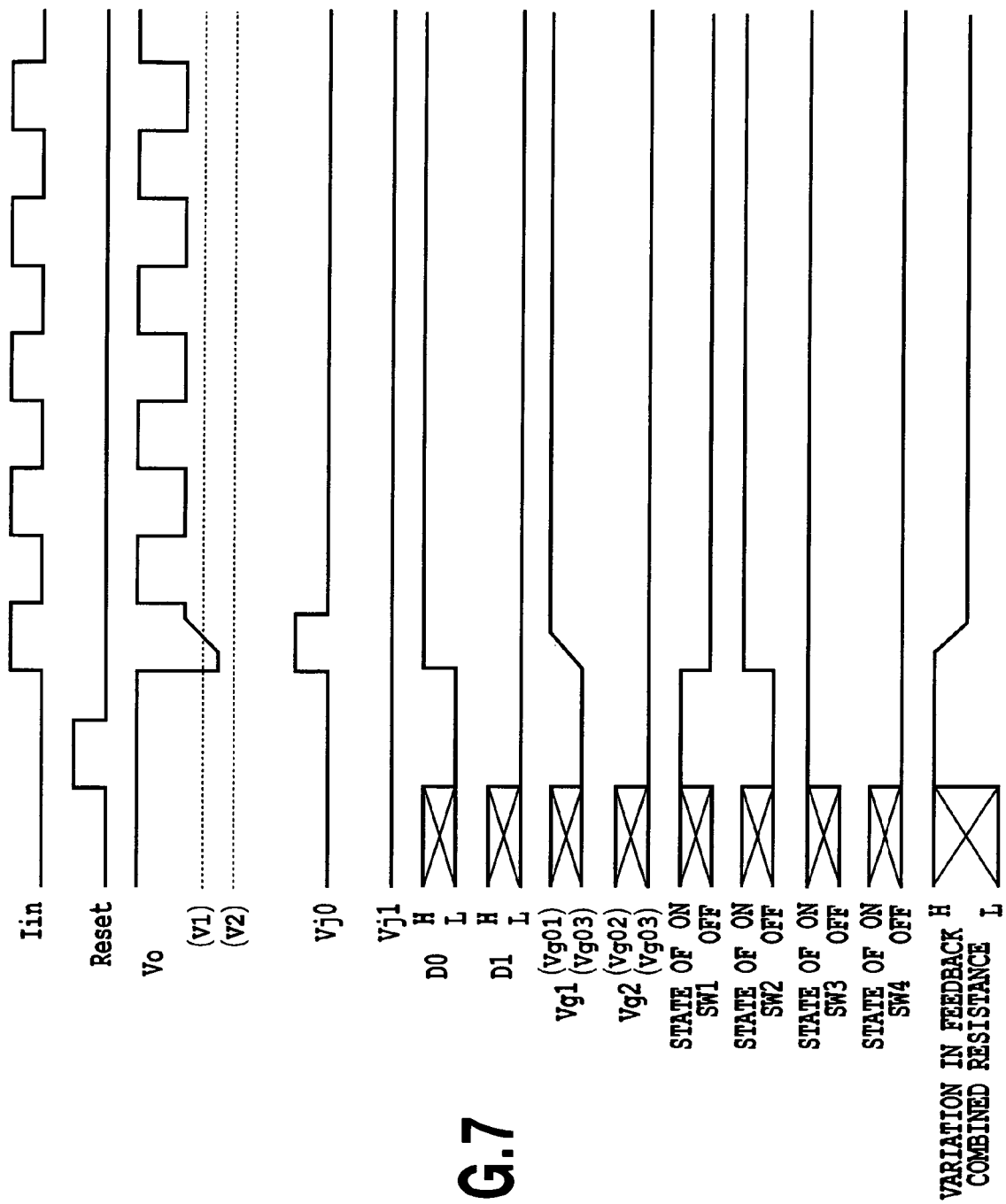
FIG. 7 is a timing chart showing an example of operation of the amplifier circuit shown in FIG. 5 performed upon reception of a middle-level input.

FIG. 7 shows an example of a timing chart where the level of an input current signal Iin is moderate, that is, somewhat smaller than that in the example shown in FIG. 6.

It is assumed that the relation between the determination reference voltages V1 and V2 is V1>V2.

After a reset signal Reset is inputted, the first pulse of a pulsed input current signal Iin outputted from the light receiving element 10 is converted into a signal output voltage Vo in the amplifier 11. The signal output voltage Vo is compared with the determination reference voltages V1 and V2 in the determining circuits 20 and 23, respectively.

Due to the comparison, from the result that the output voltage Vo exceeds only the determination reference voltage V1, only the output voltage Vj0 of the determining circuit 20 is varied. Thus, the output D0 of DFF 21, which is a memory element, is varied based on the result of the output voltage Vj0

As a result, only the gate control voltage Vg1 of the transistor 13 is varied from DC voltage Vg03 to Vg01, and the resistance value of the transistor 13 as the variable resistor is varied. Thus, the gain of the amplifier circuit is decreased and the amplitude of the output voltage Vo becomes small.

For the second and subsequent pulses of the pulsed input current signal Iin, the signal output voltage Vo of the amplifier 11 does not exceed the determination reference voltage V1 of the determining circuit 20. This shows that optimum gain control has been accomplished.

<Third Example of Operation>

A circuit operation shown in FIG. 8 will be described below.

Figure 8:
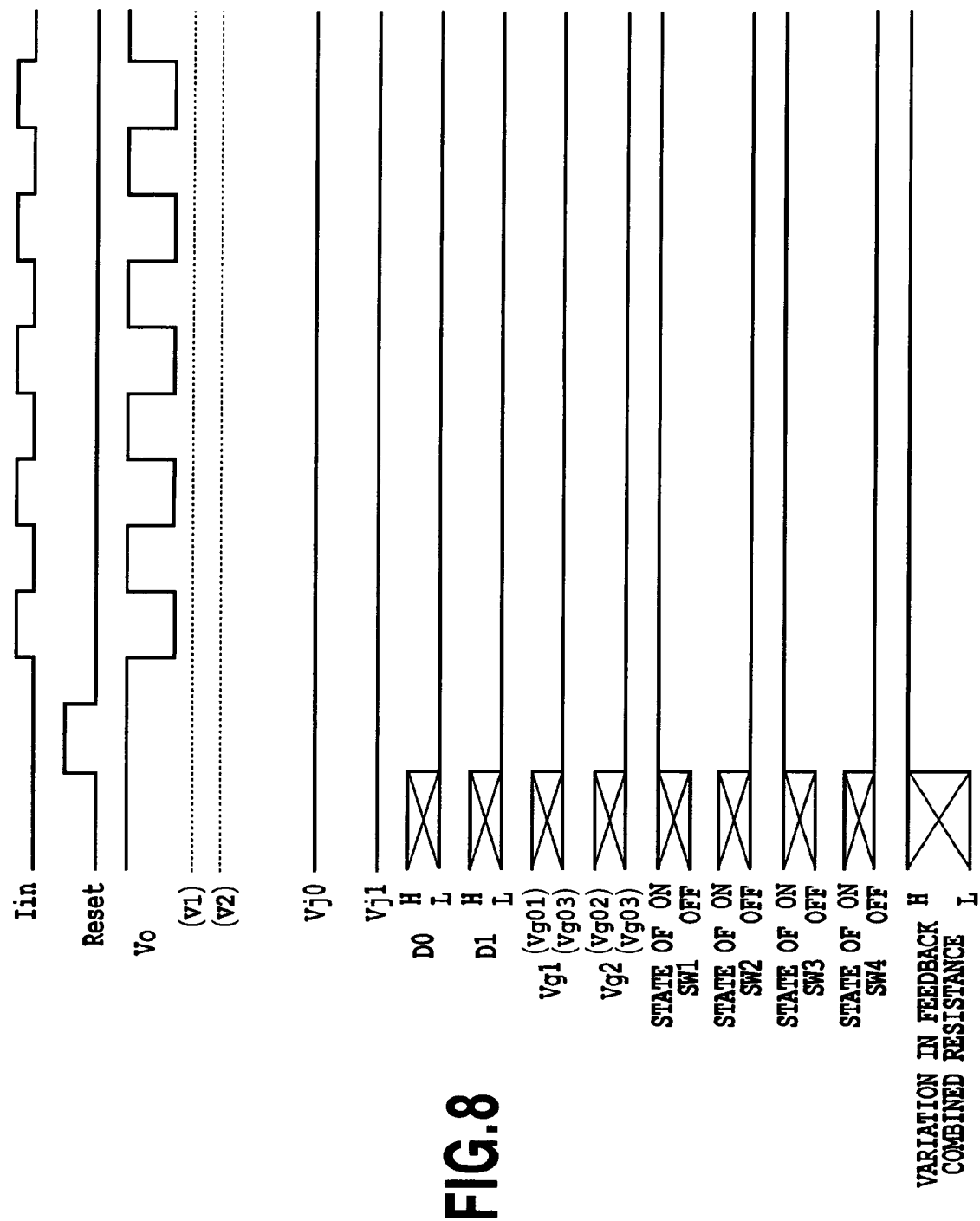
FIG. 8 is a timing chart showing an example of operation of the amplifier circuit shown in FIG. 5 performed upon reception of a small-level input.

FIG. 8 shows an example of a timing chart where the level of an input current signal is small.

After a reset signal Reset is inputted, the first pulse of a pulsed input current signal Iin outputted from the light receiving element 10 is inputted to the amplifier 11, and the signal output voltage Vo of the amplifier 11 does not exceed the determination reference voltage V1 of the determining circuit 20 as well as the determination reference voltage V2 of the determining circuit 23. Therefore, the voltages to be applied to the gates of the transistors 13 and 14 are not varied. That is, this shows that the initial state after inputting the reset signal can be obtained the optimum gain.

Thus, in the second embodiment, by a transistor is used as the feedback resistor 12, the accuracy of gain control can be improved and a wider dynamic range can be obtained. Further, noise occurring during the gain switching becomes very small and high-speed response can be obtained. In addition, the determining circuits are arranged in parallel to allow the number of bits required for gain adjustment to set only one, thereby obtaining a circuit for effective utilization of communication data.

In the first and second examples, the gate reference voltage Vg01 to be applied to the gates of the transistors 12,13,14 in the control voltage generating circuit 16 is generated by using the amplifier 30 having the same input and output characteristics as the amplifier 11, the reference transistor 31 connected across the input and output terminals of the amplifier 30, the DC input Iin 2, and the reference voltage Vr1. However, these examples are circuits for improving the absolute accuracy of variable resistance. A plurality of resistors may be connected between power supply VCC and VSS and a DC voltage divided by the resistors may be used. These circuits are not limited to the one given in the embodiment.

While the fixed feedback resistor 12 is used as a resistor element in the first example, the fixed feedback resistor 12 may be used as a transistor in the second example.

While the first and second examples are structured by using two variable resistors, the number of variable resistors is not limited to two. As the circuit structure of the present invention, the number of variable resistors may be used as one or more of three transistors. The number of determining circuits required as well as the required number and connection form of memory elements is different depending on how many input pulses are required for gain adjustment.

Third Embodiment

A third embodiment of the present invention will be described with respect to FIG. 9. The same elements as those in the embodiments described above are labeled the same reference numerals and symbols and the description of which will be omitted.

The third embodiment is an example of a light receiving apparatus including the amplifier circuit of the first and second embodiments.

Recently, as with the remarkable dissemination and development of the Internet, higher-speed as well as larger-capacity is indispensable for information transmission. In the information transmission, particularly, optical communication which uses light is becoming the mainstream. While various types of optical communication techniques have been proposed, one of features required for receiving apparatuses in common is that a signal can be received in a stable state over short distance as well as long distances (that is, the ability of providing a wide dynamic range).

As to an economical high-speed broadband optical communication technique, in ATM-PON (Asynchronous Transfer Mode-based Passive Optical Network unit) used for Fiber-To-The-Home (FTTH) systems, an optical fiber is connected between an Optical Line Terminal (OLT), which accommodates a plurality of users at a station side, and an Optical Network Unit (ONU), which terminates an optical subscriber's line at a user side, and a signal is transmitted bilaterally through the optical fiber. In particular, a signal transmitted from the ONU to the OLT is a burst signal, and each ONU is located at various distance such as a short distance or a long distance, from the viewpoint of the OLT.

Therefore, a receiving apparatus of the OLT needs a high speed response characteristic according to a burst signal as well as a wide dynamic range characteristic so that optical signals having different levels transmitted from ONUs located at different distances.

When a receiving apparatus receives a signal in a system that receives signals from a plurality of senders at different distances, such as ATM-PON, one of the important characteristics of the receiving apparatus is that whether or not the receiving apparatus can obtain how capability for reception according to a location of a sender. If the sender is located at a short distance, a level of the signal becomes large because power loss in a transmission line is small. In this case, it is essential that the output of the internal circuit of the receiving apparatus is not saturated. On the other hand, if the sender is located at a long distance, a level of the signal becomes small because power loss in a transmission line is large. In this case, large gain is required enough.

To cope with both short-distance and long-distance senders, in the receiving apparatus, a function (i.e. Automatic Gain Control: AGC) is needed such that gain is reduced automatically to prevent saturation when a signal is large but a signal is received by large gain when a signal is small. By incorporating the AGC function, a wide dynamic range for an input signal (i.e. a wide range of input signal levels can be accommodated) can be achieved.

As to optical signal level, signals having level differences by a factor of several hundred to a thousand are received. As to the length of optical fiber, signals from distances ranging from several hundred meters to several tens of kilometers are received. These values substantially vary depending on specifications.

Figure 9:
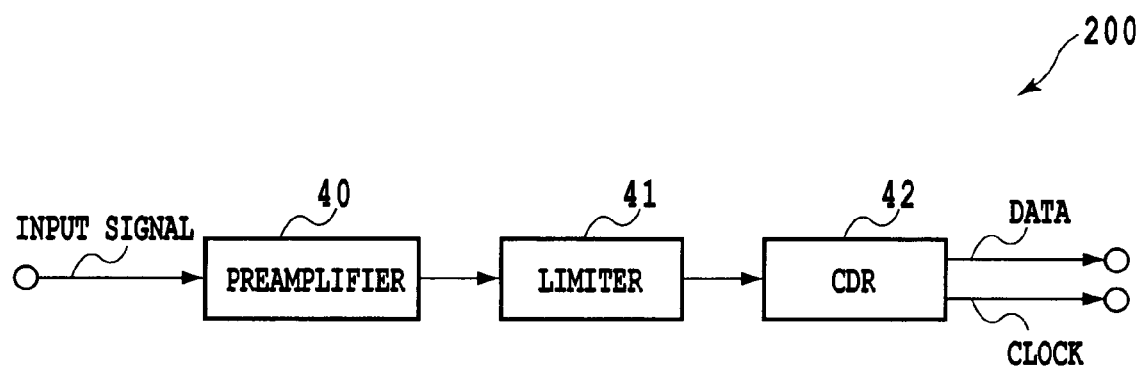
FIG. 9 is a block diagram showing a configuration of a light receiving apparatus including an amplifier circuit according to a third embodiment of the present invention.
Figure 10:
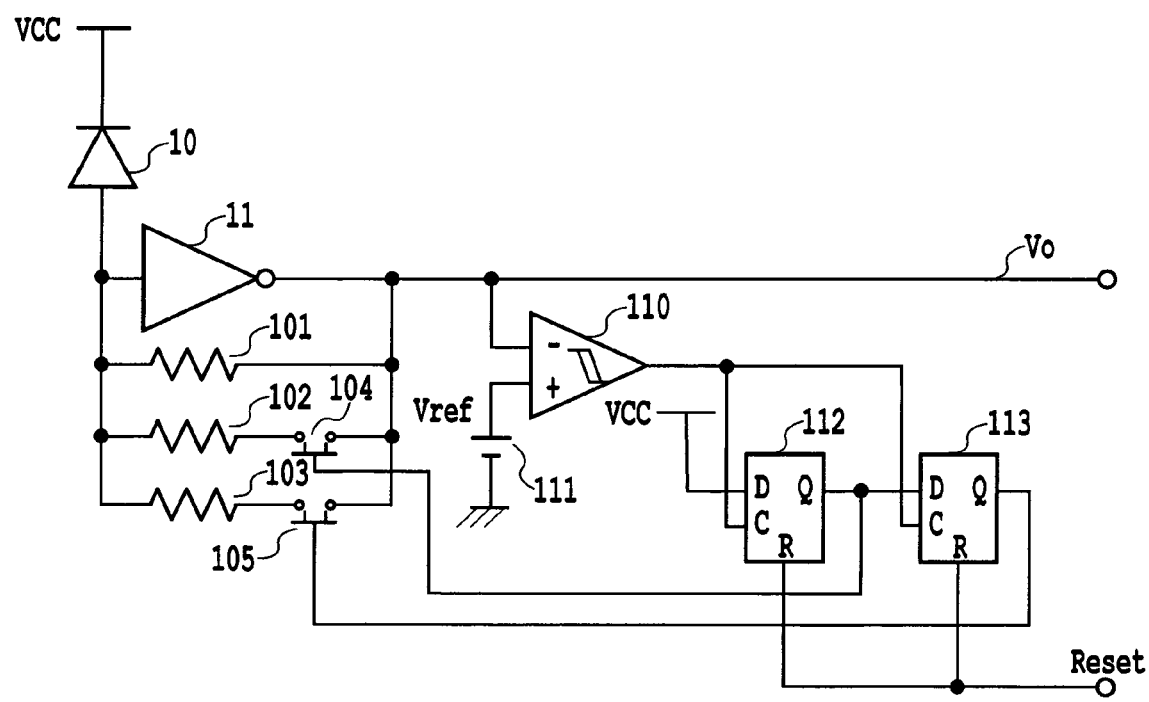
FIG. 10 is a circuit diagram showing a first example of amplifier circuit according to the conventional art.
Figure 11:
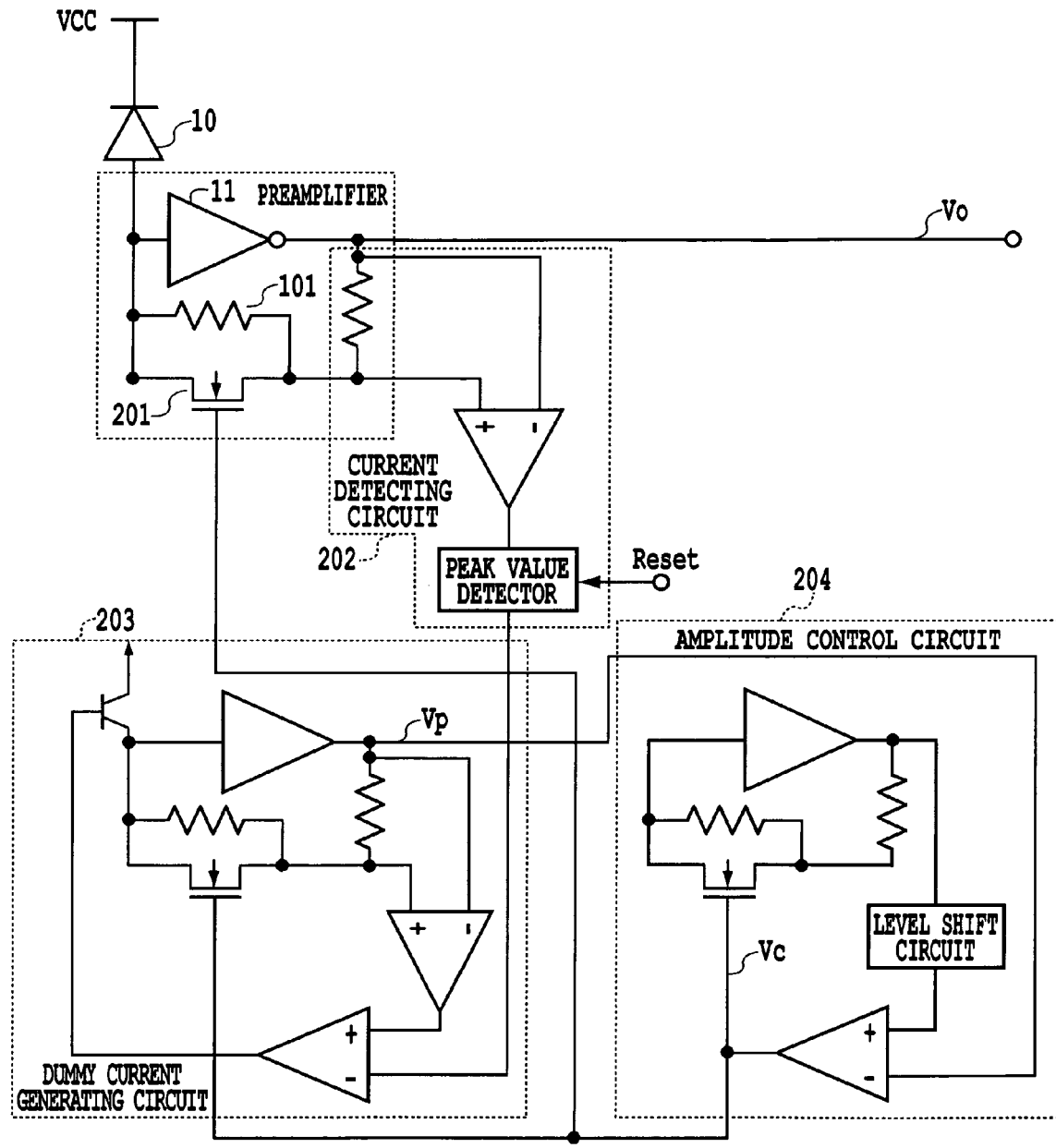
FIG. 11 is a circuit diagram showing a second example of an amplifier circuit according to the conventional art.
Figure 12:
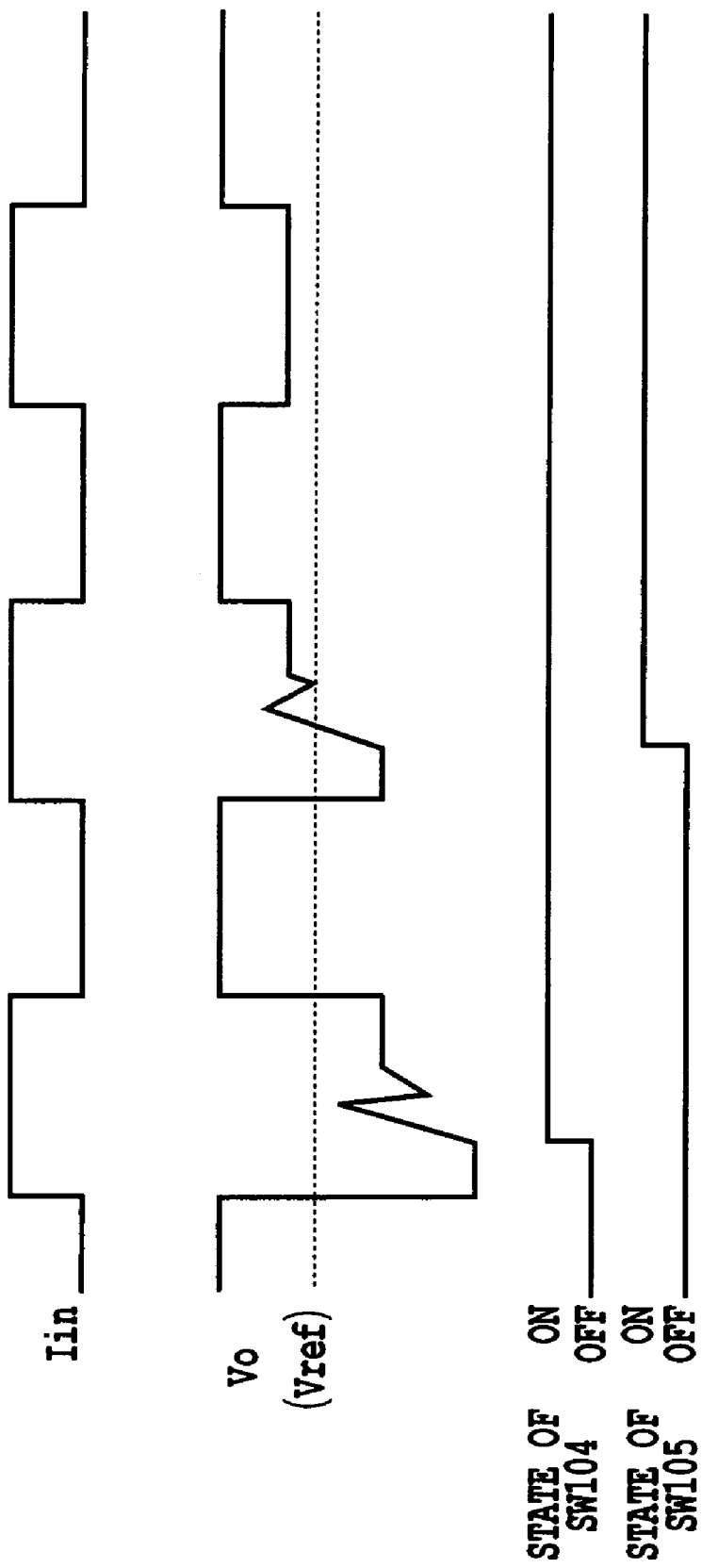
FIG. 12 is a timing chart showing an example generation of switching noise in the first example of the first-stage amplifier according to the conventional art.

FIG. 9 shows a structure of a light receiving apparatus 200.

The light receiving apparatus 200 is divided into four sections including a preamplifier 40, a limiter amplifier 41, and clock data recovery (CDR) unit 42.

The preamplifier 40 includes an amplifier circuit 100 according to the first to second examples described above (see FIGS. 1 and 5) and includes other circuits such as a post-amplifier and an automatic threshold control circuit. The limiter amplifier 41 further amplifies the output from the previous stage and digitizes a signal.

The CDR unit 42 is a circuit that receives an output signal outputted from the limiter amplifier 41 and extracts a clock component from an input signal, and outputs data in synchronization with the clock.

The CDR unit 42 is followed by a section that receives the clock and data outputted from the CDR unit 42, but the description of the section will be omitted.

In this example, an optical signal in a field of optical communication is used as an input signal, and this optical signal is received by the light receiving element 10 to produce a current signal Iin and thus the amplifying and converting process can be performed based on the current signal Iin. However, the present invention is not limited to this process.

For example, if a input signal is used in a cable broadcasting field, the present invention may be structured as a receiving apparatus including an amplifier circuit having a function that a broadcast input signal is converted through a resistor to a voltage signal, and the amplifying and converting process can be performed based on the voltage signal. In that case, a circuit structure of the amplifier circuit can be constructed referring to the circuit structure shown in FIG. 1 or 5.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. An amplifier circuit comprising:
   first amplifying means for converting an input signal to a variable-amplified output signal;
   at least one variable resistance generating means connected between the input and output terminals of the first amplifying means, wherein the variable resistance generating means comprises at least one transistor and wherein a resistance value is varied linearly according to a value of a control signal;
   determining means for determining whether the output signal outputted from the first amplifying means is greater than a predetermined threshold;
   memory means for storing a result of determination determined by the determining means; and
   control signal generating means for generating the control signal to be inputted into the variable resistance generating means, based on the result of determination stored in the memory means.

2. The amplifier circuit according to claim 1, wherein the control signal generating means comprises:
   voltage creating means for creating a voltage having a predetermined magnitude; and
   signal output means for converting the created voltage to a voltage having a predetermined magnitude, based on the result of determination stored in the memory and outputting the converted voltage as the control signal.

3. The amplifier circuit according to claim 2, wherein the voltage creating means creates a plurality of voltage signals having predetermined magnitudes.

4. The amplifier circuit according to claim 3, wherein the voltage creating means comprises:
   reference current generating means for generating a reference current;
   second amplifying means for converting the reference current generated by the reference current generating means to a variable-amplified output signal;
   reference resistance generating means, connected between the input and output terminals of the second amplifying means, for generating a reference resistance;
   third amplifying means for generating a reference signal so as to reduce the difference between the output signal outputted from the second amplifying means and a predetermined reference voltage, and inputting the generated reference signal into an input control terminal of the reference resistance generating means; and
   voltage generating means, wherein the reference signal is inputted from the third amplifying means and a plurality of voltage signals having the predetermined magnitudes are generated.

5. The amplifier circuit according to claim 4, wherein the reference current generating means comprises a bandgap reference circuit.

6. The amplifier circuit according to claim 4, wherein the predetermined reference voltage is generated by the bandgap reference circuit.

7. The amplifier circuit according to claim 3, wherein the voltage creating means comprises voltage generating means for generating the plurality of voltage signals having the predetermined magnitudes divided by a plurality of resistors connected in series.

8. The amplifier circuit according to claim 2, wherein the signal output means comprises:
   a logic circuit for generating a predetermined selection signal based on the result of the determination stored in the memory means; and
   output selecting means for selecting a given voltage signal from among the plurality of voltage signals according to the selection signal, and outputting the selected voltage signal as the control signal.

9. The amplifier circuit according to claim 1, further comprising receiving means for receiving a communication signal as the input signal and converting the communication signal into a predetermined electric signal.

10. The amplifier circuit according to claim 9, wherein the input signal is an optical signal.

11. The amplifier circuit according to claim 9, wherein the input signal is a burst signal.

12. A light receiving apparatus circuit comprising:
   a preamplifier having an amplifier according to any of claims 1 and 2 to 11;
   a limiter amplifier for converting a signal outputted from the preamplifier to a digital signal; and
   a clock data recovery unit for extracting a clock component from an output signal outputted from the limiter amplifier and outputting data in synchronization with the clock component.

* * * * *